(12) United States Patent
Tsujimura

(10) Patent No.: US 7,795,993 B2
(45) Date of Patent: Sep. 14, 2010

(54) WIRING BOARD, METHOD OF DESIGNING THE SAME, AND ELECTRONIC APPARATUS

(75) Inventor: Toshihiro Tsujimura, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 12/194,238

(22) Filed: Aug. 19, 2008

(65) Prior Publication Data

US 2009/0058570 A1    Mar. 5, 2009

(30) Foreign Application Priority Data

Aug. 29, 2007    (JP)    ............... 2007-222785

(51) Int. Cl.
*H03H 7/38*    (2006.01)
(52) U.S. Cl. .......................... 333/33; 333/32
(58) Field of Classification Search ............ 333/32, 333/33, 246, 238; 716/6
See application file for complete search history.

(56) References Cited

U.S. PATENT DOCUMENTS

2005/0104218 A1*    5/2005    Tonami et al. .............. 257/773

2006/0197625 A1    9/2006    Kashiwakura

FOREIGN PATENT DOCUMENTS

| JP | 06-216478 | 8/1994 |
| JP | 2001-127192 | 5/2001 |

* cited by examiner

*Primary Examiner*—Stephen E Jones
(74) *Attorney, Agent, or Firm*—Pillsbury Winthrop Shaw Pittman, LLP

(57) ABSTRACT

According to one embodiment, a wiring board includes a transmission line provided to perform communications between a first semiconductor chip and a second semiconductor chip, the transmission line is formed of a distributed constant wiring portion having a characteristic impedance matched to one of an output impedance of the first semiconductor chip and an output impedance of the second semiconductor chip, and a lumped constant wiring portion which is narrower than the distributed constant wiring portion and shorter than a length which can be regarded as a lumped constant circuit.

6 Claims, 6 Drawing Sheets

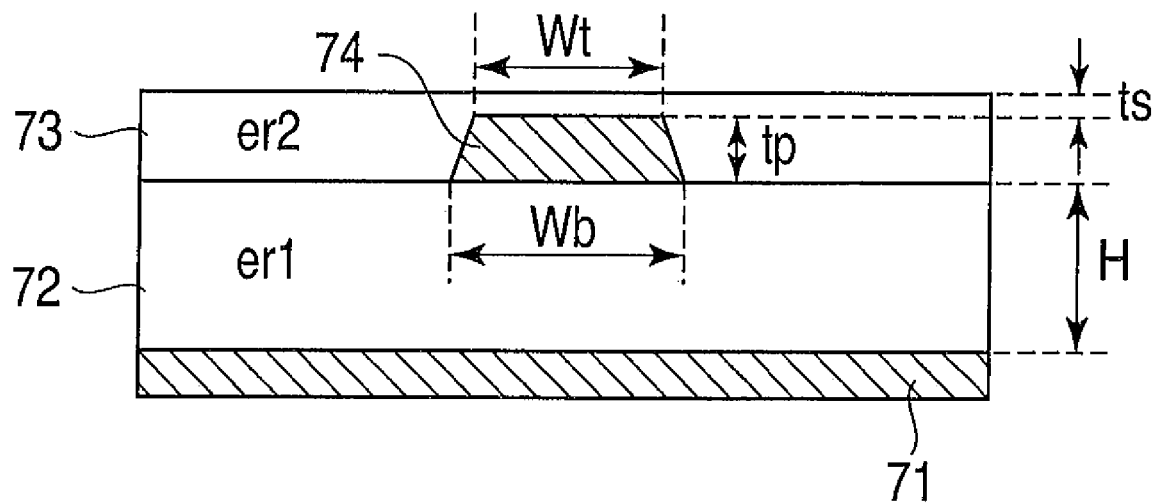
F I G. 9
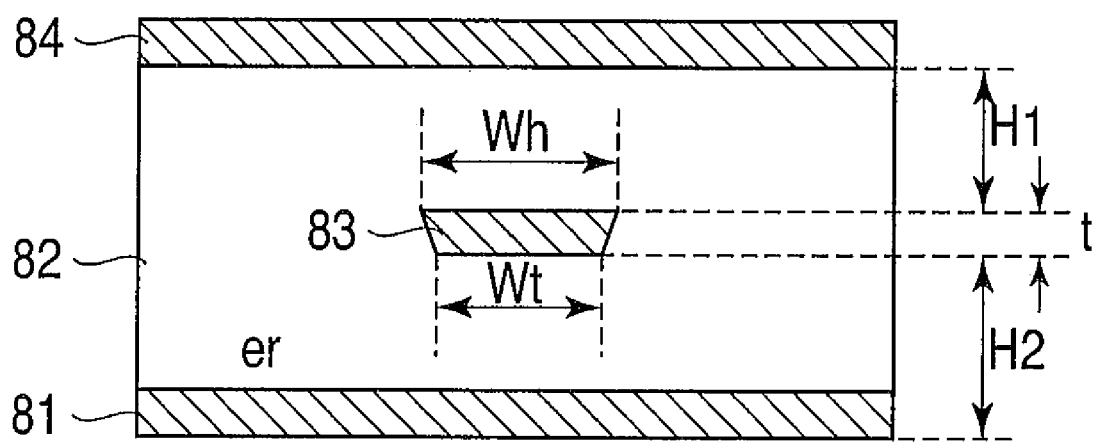
F I G. 10

US 7,795,993 B2

WIRING BOARD, METHOD OF DESIGNING THE SAME, AND ELECTRONIC APPARATUS

CROSS-REFERENCE TO RELATED APPLICATIONS

This application is based upon and claims the benefit of priority from Japanese Patent Application No. 2007-222785, filed Aug. 29, 2007, the entire contents of which are incorporated herein by reference.

BACKGROUND

1. Field

One embodiment of the present invention relates to a wiring board which suppresses increased area, a method of designing the wiring board, and an electronic apparatus.

2. Description of the Related Art

Design of wiring boards has become difficult with increased frequency. When the output impedance of an IC driver is the same as the characteristic impedance of the transmission line, no reflection noise occurs. However, adjusting the impedance of the transmission line to obtain impedance matching increases the width of the line. Although there is also a method of obtaining impedance matching by inserting a damping resistor or the like, it is necessary to insert the resistor close to the IC driver, and provide wiring on the surface of the wiring board for part mounting. These cause problems of increased area of the wiring board and increased cost of parts.

Jpn. Pat. Appln. KOKAI Pub. No. 2001-127192 discloses a semiconductor device mounting board, in which a line drawn from an electrode pad is made narrow and has a length not influenced by reflection due to impedance mismatching, and lines in other parts are made heavy.

As described above, when the impedance of the transmission line is adjusted to obtain impedance matching, the wiring width is increased, and so the area of the wiring board is increased. Further, inserting a damping resistor or the like to obtain impedance matching increases the area of the wiring board and increases the cost.

In addition, the above document fails to disclose the specific length not influenced by reflection due to impedance mismatching.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 9 is an exemplary diagram illustrating a model of a microstrip line; and

FIG. 10 is an exemplary diagram illustrating a model of a strip line.

DETAILED DESCRIPTION

Various embodiments according to the invention will be described hereinafter with reference to the accompanying drawings. In general, according to one embodiment of the invention, a wiring board comprises a transmission line provided to perform communications between a first semiconductor chip and a second semiconductor chip, the transmission line is formed of a distributed constant wiring portion having a characteristic impedance matched to one of an output impedance of the first semiconductor chip and an output impedance of the second semiconductor chip, and a lumped constant wiring portion which is narrower than the distributed constant wiring portion and shorter than a length which can be regarded as a lumped constant circuit.

First, a structure of an electronic apparatus according to an embodiment of the present invention is explained with reference to FIG. 1. The electronic apparatus is realized as a notebook type personal computer 10 which can be operated by batteries.

Figure 1:
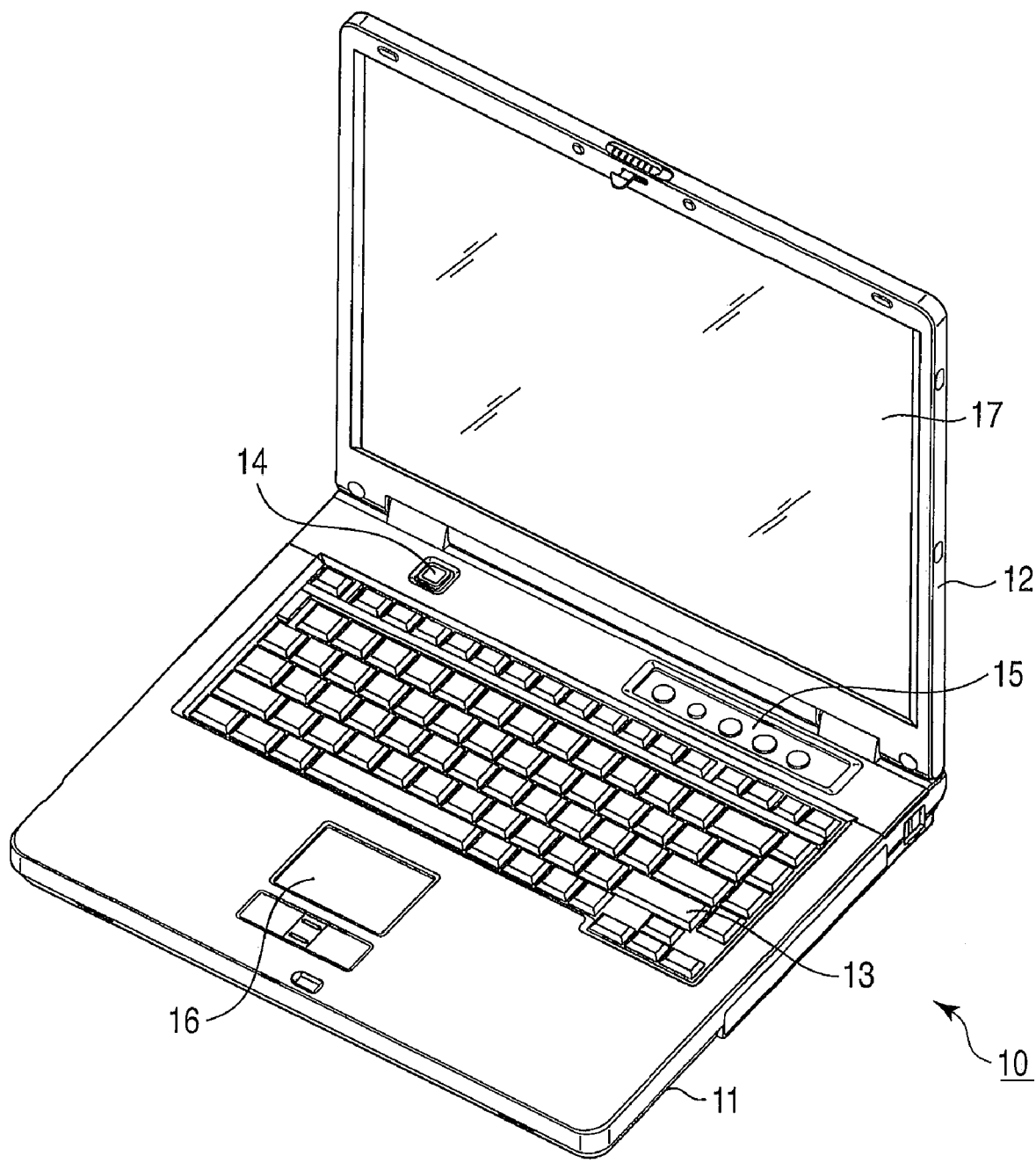
FIG. 1 is an exemplary perspective view illustrating a structure of an electronic apparatus according to an embodiment of the present invention.

FIG. 1 is a perspective view of the notebook type personal computer 10 in the state where a display unit is opened. The computer 10 comprises a computer main body 11 and a display unit 12. The display unit 12 is equipped with a display panel formed of a liquid crystal display (LCD) 17 and backlight, and the display screen of the LCD 17 is positioned in almost the center of the display unit 12. The LCD 17 is formed of a translucent liquid crystal panel.

The display unit 12 is supported by the computer main body 11, and attached to the computer main body 11, such that the display unit 12 is rotatable between an opened position in which the top surface of the computer main body 11 is exposed and a closed position in which the top surface of the computer main body 11 is covered. The computer main body 11 has a thin box-shaped housing. The top surface of the computer main body 11 is provided with a keyboard 13, a power button 14 to power on/off the computer 10, an input operation panel 15, and a touch pad 16, etc.

The input operation panel 15 is an input device to input events corresponding to pressed buttons, and has a plurality of buttons to start respective functions.

Figure 2:
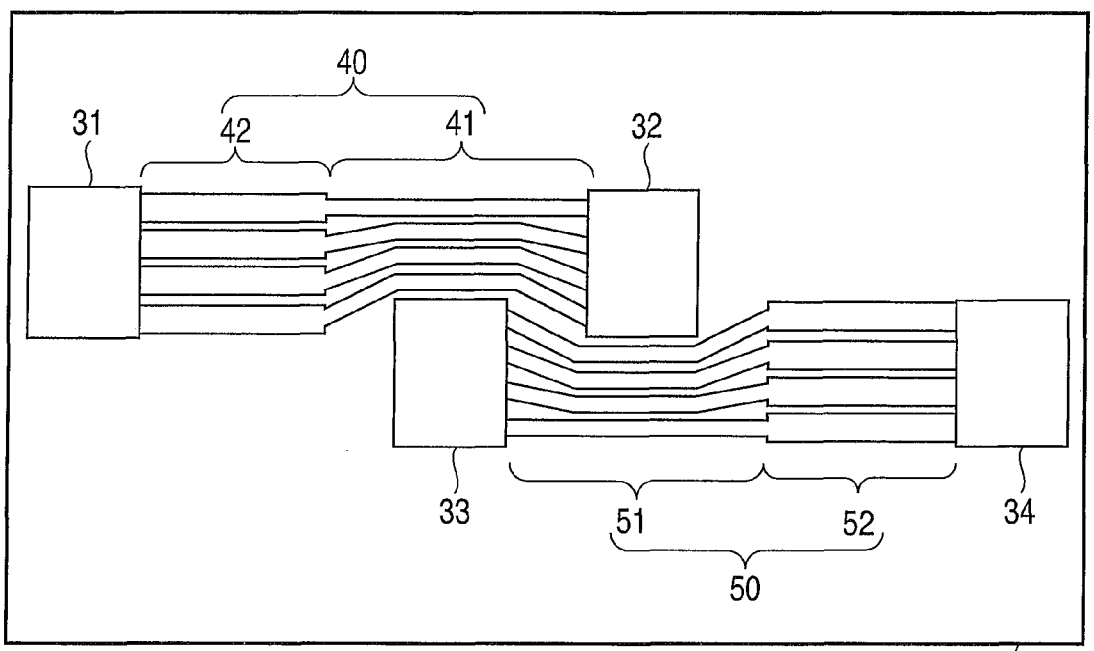
FIG. 2 is an exemplary plan view illustrating part of a structure of a wiring board which is provided inside the electronic apparatus illustrated in FIG. 1, and on which semiconductor chips are mounted.

FIG. 2 is a plan view illustrating part of a structure of a wiring board which is provided inside the electronic apparatus illustrated in FIG. 1, and on which semiconductor chips are mounted.

A first semiconductor chip 31, a second semiconductor chip 32, a third semiconductor chip 33, and a fourth semiconductor chip 34 are mounted on a printed wiring board 30. The printed wiring board 30 is provided with a signal line (transmission line) 40 to perform communications between the first semiconductor chip 31 and the second semiconductor chip 32. The printed wiring board 30 is also provided with a signal line (transmission line) 50 to perform communications between the third semiconductor chip 33 and the fourth semiconductor chip 34.

The signal lines 40 and 50 are formed of lumped constant wiring portions 41 and 51 regarded as lumped constant circuits, and distributed constant wiring portions 42 and 52 regarded as distributed constant circuits, respectively.

The characteristic impedance of the distributed constant wiring portion 42 is matched to the output impedance of the semiconductor chip on the signal output side among the first semiconductor chip 31 and the second semiconductor chip 32. The characteristic impedance of the distributed constant wiring portion 52 is matched to the output impedance of the semiconductor chip on the signal output side among the third semiconductor chip 33 and the fourth semiconductor chip 34.

When the first semiconductor chip 31 and the second semiconductor chip 32 perform interactive communications, the characteristic impedance of the distributed constant wiring portion 42 is matched to the output impedance of the first semiconductor chip 31 and the second semiconductor chip 32. In the same manner, when the third semiconductor chip 33 and the fourth semiconductor chip 34 perform interactive communications, the characteristic impedance of the distributed constant wiring portion 52 is matched to the output impedance of the third semiconductor chip 33 and the fourth semiconductor chip 34.

In the lumped constant wiring portions 41 and 51, the output impedance of the semiconductor chip on the output side is not matched to the characteristic impedance. In addition, the wiring width of the lumped constant wiring portions 41 and 51 is narrower than the wiring width of the distributed constant wiring portions 42 and 52.

Figure 3:
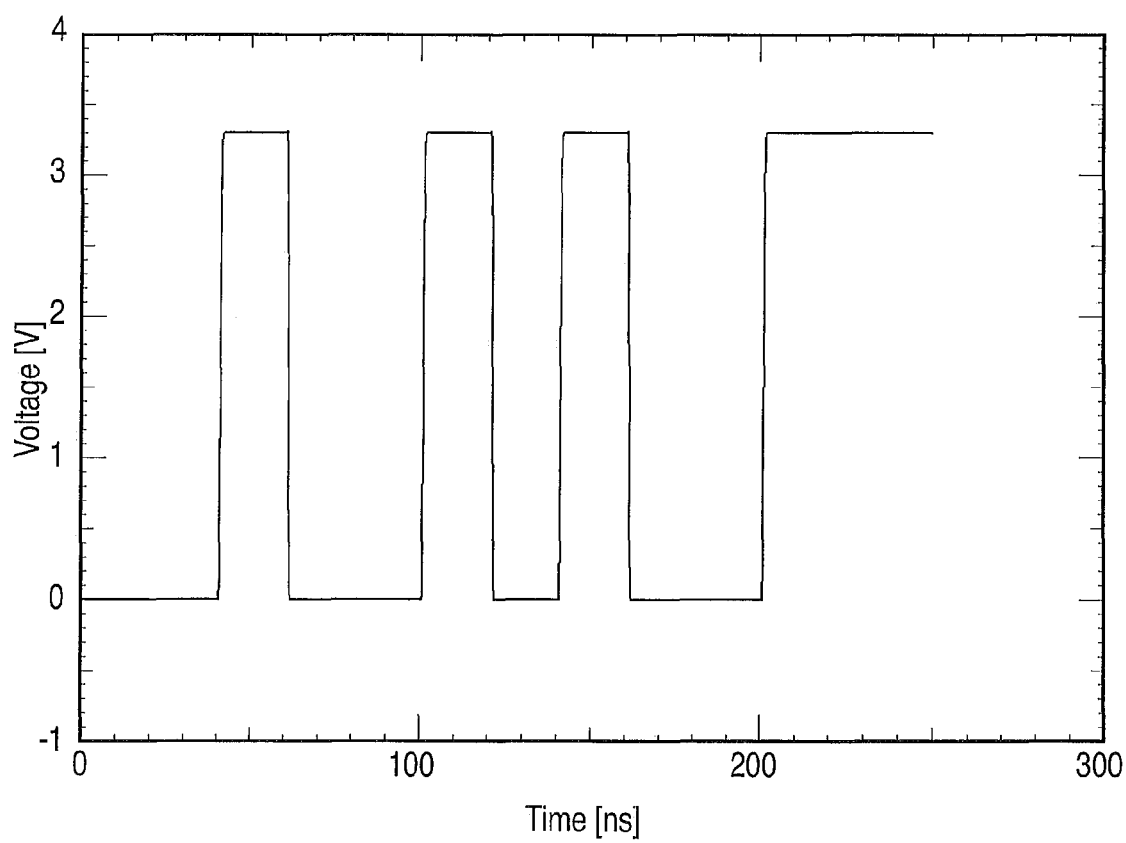
FIG. 3 is an exemplary waveform diagram illustrating a simulation result of a signal waveform in the case where a signal flowing between a first semiconductor chip and a second semiconductor chip is supplied to a signal line formed of only a lumped constant wiring portion illustrated in FIG. 2.

FIG. 3 illustrates a simulation result of a signal waveform when a signal flowing between the first semiconductor chip 31 and the second semiconductor chip 32 is supplied to a signal line formed of only the lumped constant wiring portion 41. In the same manner, FIG. 4 illustrates a simulation result of a signal waveform when a signal flowing between the first semiconductor chip 31 and the second semiconductor chip 32 is supplied to a signal line formed of only the distributed constant wiring portion 42.

As illustrated in FIG. 3, when a wiring length between a pair of semiconductor chips is short, reflection noise occurs earlier than rise of the signal and does not affect the signal, even when the characteristic impedance of the wiring portion is not matched to the output impedance of the semiconductor chip on the signal output side. This line is a line which can be regarded as a lumped constant circuit. However, the wiring length which can be designed by using lumped constant circuits is short, and most of actual wiring must be designed by using distributed constant circuits.

Figure 4:
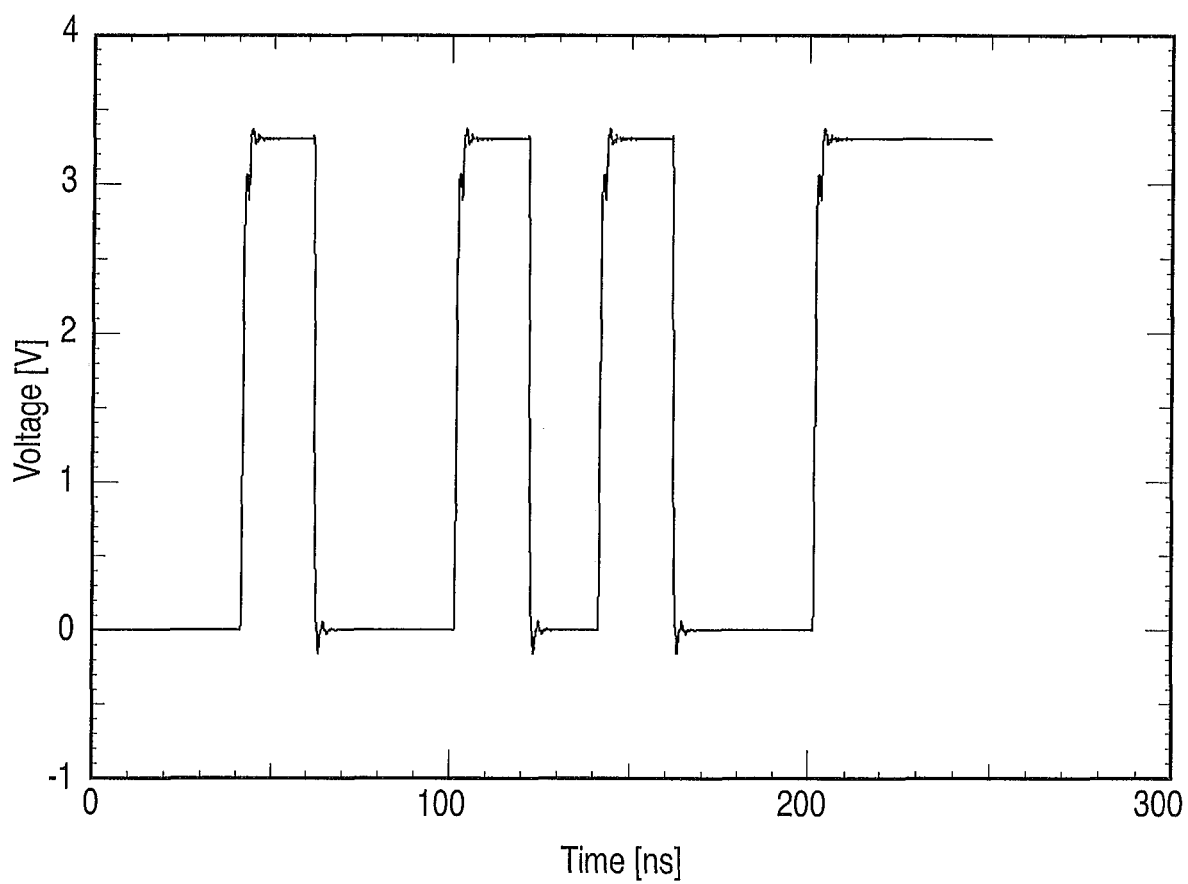
FIG. 4 is an exemplary waveform diagram illustrating a simulation result of a signal waveform in the case where a signal flowing between the first semiconductor chip and the second semiconductor chip is supplied to a signal line formed of only the distributed constant wiring portion illustrated in FIG. 2.

As illustrated in FIG. 4, when the output impedance of the semiconductor chip is the same as the characteristic impedance of the transmission line (when impedance matching is obtained), no reflection noise occurs. However, adjusting the characteristic impedance of the transmission line to obtain impedance matching increases the wiring width. In addition, although there is also a method of obtaining impedance matching by inserting a damping resistor or the like, it is necessary to insert the resistor close to the IC driver, and provide wiring on the surface of the wiring board for part mounting. These cause problems of increased area of the wiring board and increased cost of parts.

Figure 5:
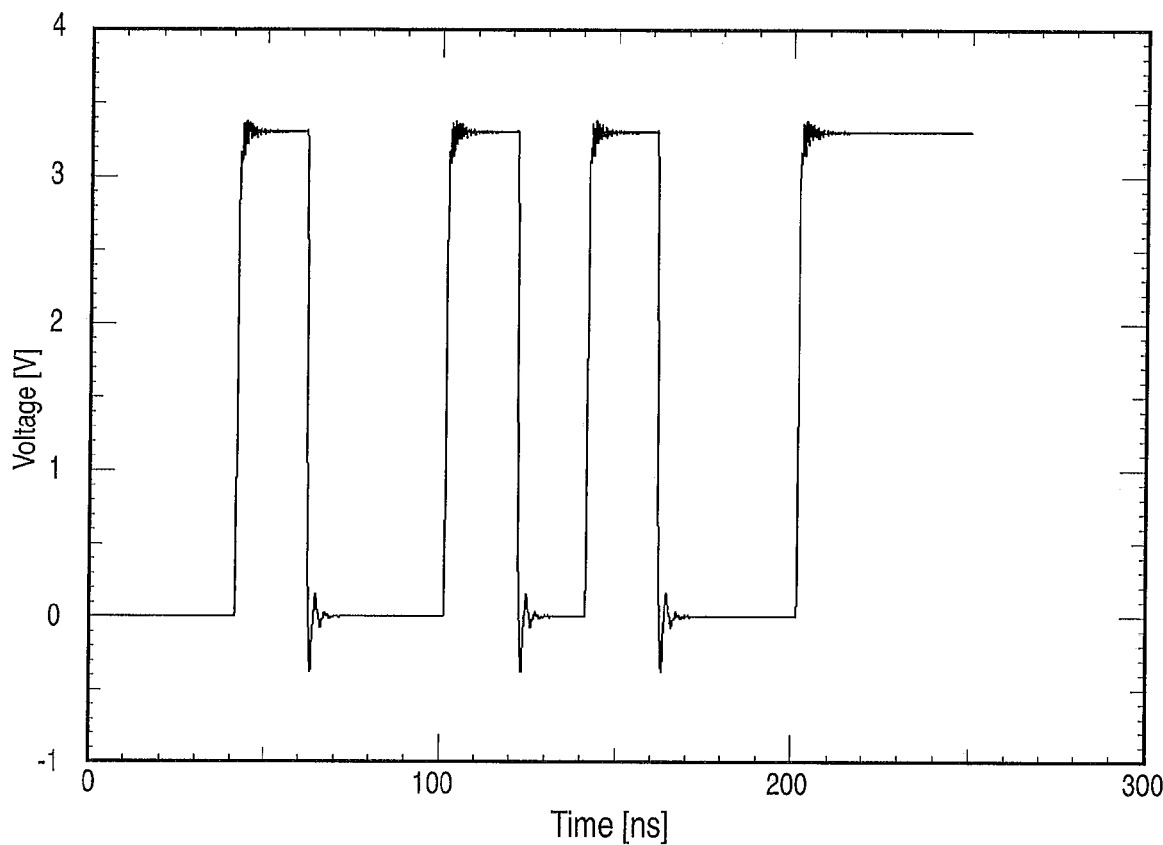
FIG. 5 is an exemplary waveform diagram illustrating a simulation result of a signal waveform in the case where a signal flowing between the first semiconductor chip and the second semiconductor chip is supplied to the signal line illustrated in FIG. 2.

FIG. 5 illustrates a simulation result of a signal waveform when a signal flowing between the first semiconductor chip 31 and the second semiconductor chip 32 is supplied to the signal line illustrated in FIG. 2. Although there is a slight reflection noise, it does not affect the operation. Thereby, it is possible to reduce the influence of reflection noise, and reduce the area of the printed wiring board.

The transmission line illustrated in FIG. 2 can be regarded as a distribution constant circuit. The distributed constant wiring portions 42 and 52 having matched impedance are combined with the lumped constant wiring portions 41 and 51 which can be regarded as lumped constant circuits, respectively, and thereby there is no influence on the signal as illustrated in FIG. 5. Therefore, it is unnecessary to insert a damping resistor or the like, and it is possible to suppress increased area of the printed wiring board and increased cost of parts.

Figure 6:
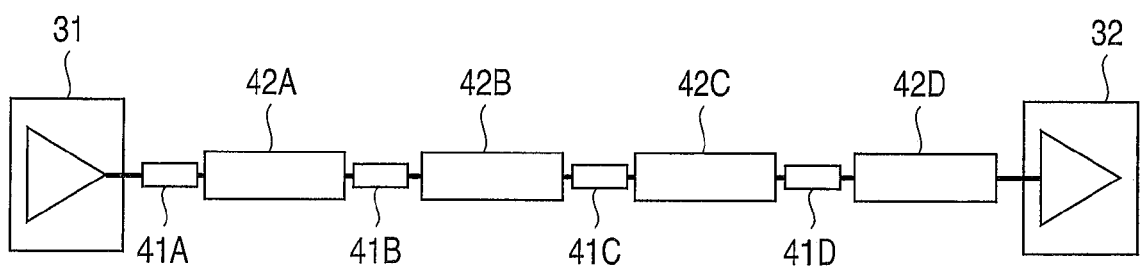
FIG. 6 is an exemplary diagram illustrating a modification of a transmission line.

As illustrated in FIG. 6, each of the lumped constant wiring portions 41 and 51 may be divided into a plurality of divided wiring regions 41A to 41D, and each distributed constant wiring portion may be divided into a plurality of regions 42A to 42D in the same manner. Also in this case, the total length of the divided wiring regions 41A to 41D must be shorter than the length which can be regarded as a lumped constant circuit.

Figure 7:
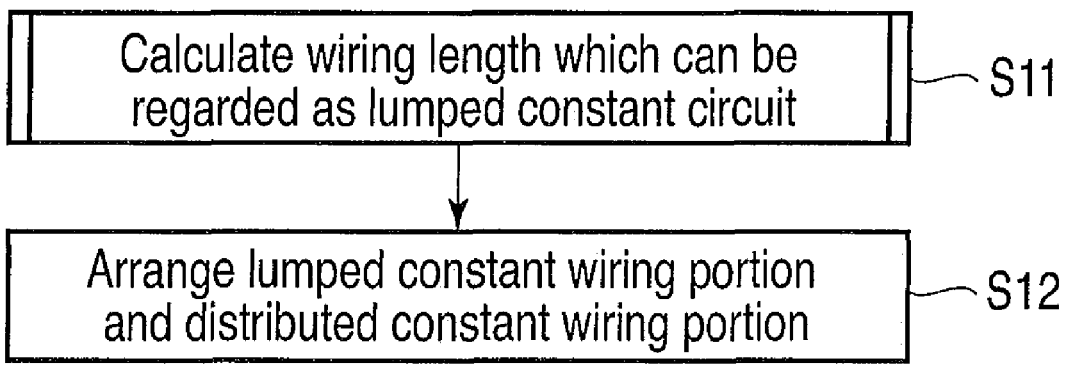
FIG. 7 is an exemplary flowchart illustrating a procedure of a method of designing a wiring board according to the embodiment of the present invention.

Next, a method of designing the above wiring board is explained below with reference to the flowchart of FIG. 7.

First, a wiring length which can be considered as a lumped constant circuit is calculated (Step S11). Thereafter, a lumped constant wiring portion and a distributed constant wiring portion are arranged on the basis of the calculated wiring length (Step S12).

Figure 8:
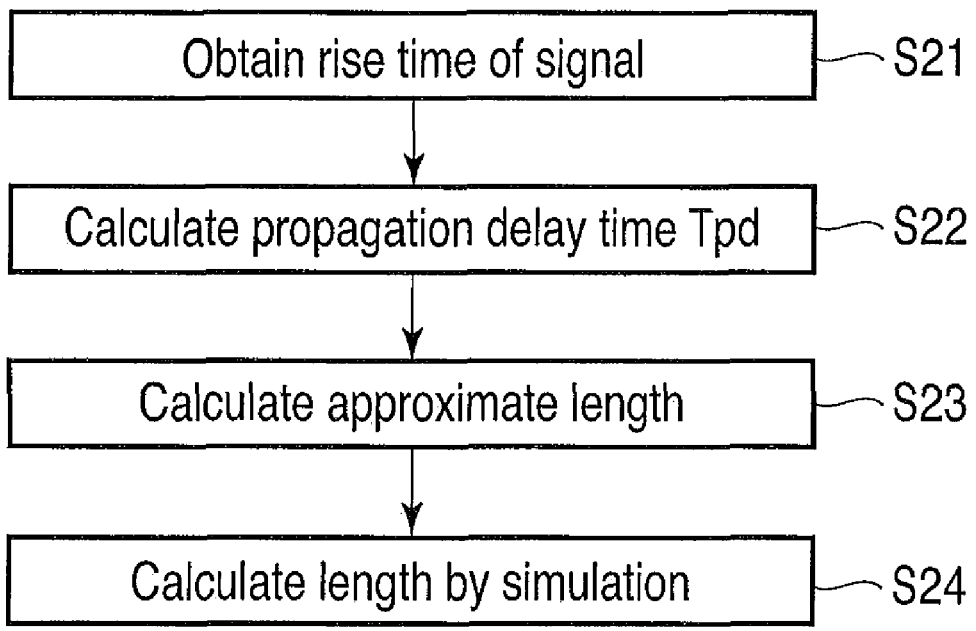
FIG. 8 is an exemplary flowchart illustrating a procedure of a method of calculating a wiring length which can be regarded as a lumped constant circuit.

Next, a method of calculating a wiring length which can be considered as the lumped constant circuit in Step S11 is explained below with reference to FIG. 8.

Generally, there is no clear boundary between the distributed constant line and the lumped constant line. However, when the transmission time of the transmission line is short with respect to the signal rise time, the signal rising edge reaches the end of the transmission line and reflection begins before the signal completely rises. Therefore, ringing occurs little.

Conversely, when the transmission time of the transmission line is long with respect to the signal rise time, the signal reaches the end of the transmission line and reflection occurs after the signal has risen. Therefore, ringing occurs. However, also in this case, when impedance matching is obtained, reflection occurs little and no ringing occurs.

The signal rise time Tr is read from IC buffer information (described in the Simulation Program with Integrated Circuit Emphasis [SPICE] model or I/O Buffer Information Specification [IBIS] model) (Step S21). Since the propagation speed "$Vp=1/\sqrt{(LC)}[m/s]$" is determined based on the inductance L and the capacitance C of the transmission line, the propagation delay time "$T_{pd}=\sqrt{(LC)}[s]$" per unit length of the transmission line is calculated (Step S22). Then, an approximate wiring length is determined such that the propagation delay time "$T_{pd}=\sqrt{(LC)}[s]$" is set shorter than the signal rise time Tr (Tr>Tpd) (Step S23).

To determine a specific wiring length, a simulation is performed using a model of the driver, the receiver, and the transmission line (Step S24). The wiring length in which the wiring width can be made nallower is determined, on the basis of a waveform calculated by the simulation.

When the distributed constant wiring portions are arranged, the output impedance of the semiconductor chip on the signal output side is matched to the characteristic impedance of the distributed constant wiring portions 42 and 52.

Calculation of Characteristic Impedance of Board Transmission Line

In board transmission lines, the characteristic impedance depends on the line width w, the distance H from surface of the solid conductive layer, and the relative dielectric constant of an insulating material provided therebetween. Examples of the board transmission line are a microstrip line illustrated in FIG. 9 and a strip line illustrated in FIG. 10.

The model of a microstrip line illustrated in FIG. 9 has a ground plane 71, a first dielectric layer 72, a second dielectric layer 73, and a microstrip line 74. The dielectric constant and the thickness of the first dielectric layer 72 are $\in$r1 and H, respectively. The thickness, the top width, and the bottom width of the microstrip line 74 are tp, Wt, and Wb, respectively. The dielectric constant of the second dielectric layer 73 is $\in$r2. The thickness of the second dielectric layer 73 from the surface of the microstrip line 74 is ts.

The model of a strip line illustrated in FIG. 10 has a ground pattern 81, a dielectric layer 82, a strip line 83, and a circuit pattern 84. The dielectric constant of the dielectric layer 82 is $\in$r. The height of the bottom surface of the strip line 83 from the bottom surface of the ground pattern 81 is H2. The thickness of the dielectric layer 82 from the surface of the strip line 83 is H1. The top width and the bottom width of the strip line 83 are Wh and Wt, respectively.

Calculation of Output Impedance

Usually, the output resistance is determined by using a simulation, although the output impedance can be determined from the inclination of the V-I curve of the buffer on the basis of the I/O Buffer Information Specification (IBIS) model which describes the data specifications of the input/output buffers of the semiconductor chip.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A wiring board comprising:
a transmission line provided to perform communications between a first semiconductor chip and a second semiconductor chip, the transmission line is formed of a distributed constant wiring portion having a characteristic impedance matched to one of an output impedance of the first semiconductor chip and an output impedance of the second semiconductor chip, and a lumped constant wiring portion which is narrower than the distributed constant wiring portion and shorter than a length which can be regarded as a lumped constant circuit.

2. A wiring board according to claim 1, wherein a characteristic impedance of the lumped constant wiring portion is not matched to one of the output impedance of the first semiconductor chip and the output impedance of the second semiconductor chip.

3. A wiring board according to claim 1, wherein the lumped constant wiring portion has a plurality of divided wiring regions, and a total length of the divided wiring regions is shorter than the length which can be regarded as the lumped constant circuit.

4. An electronic apparatus on which a first semiconductor chip and a second semiconductor chip performing communications with the first semiconductor chip are mounted, comprising a line provided to perform communications between the first semiconductor chip and the second semiconductor chip, the line being formed of a distributed constant wiring portion which has a characteristic impedance matched to one of an output impedance of the first semiconductor chip and an output impedance of the second semiconductor chip, and a lumped constant wiring portion which is narrower than the distributed constant wiring portion and shorter than a length which can be regarded as a lumped constant circuit.

5. An electronic apparatus according to claim 4, wherein a characteristic impedance of the lumped constant wiring portion is not matched to one of the output impedance of the first semiconductor chip and the output impedance of the second semiconductor chip.

6. An electronic apparatus according to claim 4, wherein the lumped constant wiring portion has a plurality of divided wiring regions, and a total length of the divided wiring regions is shorter than the length which can be regarded as the lumped constant circuit.

* * * * *